(12) United States Patent
Tomitsuka et al.

(10) Patent No.: US 6,509,714 B2
(45) Date of Patent: Jan. 21, 2003

(54) SECONDARY BATTERY WITH TERMINALS AND CAPACITOR WITH TERMINALS

(75) Inventors: Koji Tomitsuka, Sendai (JP); Kenji Ogata, Sendai (JP); Taisuke Takiguchi, Sendai (JP); Shunji Watanabe, Sendai (JP)

(73) Assignee: SII Micro Parts Ltd. (JP)

( * ) Notice: Subject to any disclaimer, the term of this patent is extended or adjusted under 35 U.S.C. 154(b) by 0 days.

(21) Appl. No.: 10/005,688

(22) Filed: Nov. 8, 2001

(65) Prior Publication Data

US 2002/0119366 A1 Aug. 29, 2002

(51) Int. Cl.[7] .......................................... H01M 10/216
(52) U.S. Cl. ....................................... 320/107; 320/166
(58) Field of Search ................................ 320/107, 110, 320/112, 116, 166, 167; 429/99, 100

(56) References Cited

U.S. PATENT DOCUMENTS 3,220,888 A * 11/1965 Moore et al.
5,818,198 A * 10/1998 Mito et al.
6,014,009 A * 1/2000 Wierzbicki et al.

* cited by examiner

Primary Examiner—Edward H. Tso
(74) Attorney, Agent, or Firm—Adams & Wilks

(57) ABSTRACT

A secondary battery or capacitor fitted with terminals and occupies less area on a packaging substrate. Either one of the positive and negative terminals is mounted within the outer surface of the secondary battery or capacitor. This reduces the area occupied by the secondary battery or capacitor fitted with terminals on the substrate. At least one step is formed on the terminal positioned opposite to the substrate. This prevents electrical shorting between the positive electrode can and the negative terminal.

12 Claims, 8 Drawing Sheets

SECONDARY BATTERY WITH TERMINALS AND CAPACITOR WITH TERMINALS

BACKGROUND OF THE INVENTION

1. Field of the Invention

The present invention relates to button or coin shaped secondary batteries and capacitors capable of being reflow soldered and, more particularly, to the structure of secondary battery or capacitor having terminals.

2. Description of the Related Art

Coin or button shaped primary and secondary batteries and capacitors which are used as auxiliary power supplies for backup for clocks and memories of portable devices are generally fitted with terminals for taking leads from the positive and negative electrodes of the batteries in use.

With respect to their terminal shapes, components have decreased in size in recent years. In a known type, terminals are inserted into a mounting board or substrate provided with holes for terminals, and the terminals are soldered from the rear side of the substrate (FIGS. 1 and 2). Also, the surface mount type (FIGS. 3–6) is prevalent. In particular, a secondary battery or capacitor fitted with terminals is placed on a substrate intact. Solder-plated portions at the front ends of the terminals are placed on the front surface of the substrate. A soldering operation is performed from this front side of the substrate. The terminals of the surface mount type are so shaped that both positive and negative terminals extend a considerable distance outwardly from the outer surface of a button or coin shaped secondary battery or capacitor, for the following reason. The positive and negative terminals are hand soldered to the substrate and so the secondary battery or capacitor is protected from thermal effects.

Recently, button or coin shaped secondary batteries and capacitors have been increasingly required to be capable of being reflow soldered in order to streamline mounting operations. In the past, gaskets made of polypropylene were used. Secondary batteries and capacitors which use better heatproof gaskets made of thermoplastic engineering materials such as polyphenylene sulfide and which can be reflow soldered have been devised and put into practical use.

To surface-mount a secondary battery or capacitor, which can be reflow soldered, to a substrate, it has been necessary to bring the surfaces of the positive and negative terminals into parallel contact with the substrate surface simply if the secondary battery or capacitor having the terminals is placed on the substrate surface. with respect to the terminal shape, where the positive and negative terminals are directed in the same direction (FIGS. 7 and 8), the center of gravity of the secondary battery or capacitor having the terminals has poor balance. This is unsuited for surface mounting. Where positive and negative terminals are directed in opposite directions (FIGS. 3–6; spaced apart by 180°), both positive and negative terminals easily make parallel contact with a substrate. Therefore, this type is advantageous for surface mounting and has become a mainstream.

With respect to terminal shapes of surface mount type secondary batteries and capacitors that can be reflow soldered, the shape type in which positive and negative terminals are spaced apart by 180° and directed in opposite directions is mainstream. This shape has the disadvantage that where a secondary battery or capacitor with terminals is surface-mounted to a substrate by a reflow process, the secondary battery or capacitor with terminals occupies a large area on the substrate. As components have been required to be fabricated in smaller size, it is quite important to minimize the area occupied on the substrate by the secondary battery or capacitor with terminals.

SUMMARY OF THE INVENTION

The present invention provides a structure, where either one of positive and negative terminals is placed within a square that the outer surface of a button or coin shaped secondary battery or capacitor inscribes. This greatly reduces the area taken up on the substrate by the secondary battery or capacitor fitted with the terminals.

Where the negative electrode side is placed opposite to the substrate surface, the positive electrode can and the negative terminal are brought into contact with each other by the weight of the secondary battery or capacitor after reflow solder. This creates the possibility that the positive and negative electrodes are shorted to each other. To prevent this electrical shorting, at least one step is formed on the negative terminal mounted on the negative electrode can opposite to the substrate surface. Further details of the configuration of the present invention are as follows.

(1) A secondary battery or capacitor fitted with terminals. The positive and negative terminals are mounted to the secondary battery or capacitor to take leads. Either one of these two terminals is placed substantially within a square that the outer surface of the secondary battery or capacitor inscribes.

(2) A secondary battery or capacitor fitted with terminals. The positive and negative terminals are mounted to the secondary battery or capacitor. The solder-plated portions of the positive and negative terminals are placed parallel to the substrate surface on which the secondary battery or capacitor is mounted.

(3) A secondary battery or capacitor fitted with terminals including a terminal opposite to the substrate surface on which the secondary battery or capacitor is mounted. The terminal opposite to the substrate surface has at least one step.

Generally, many of electronic components mounted on substrates are rectangular in shape. Therefore, where a round secondary battery or capacitor is mounted, dead space is created. As shown in FIG. 15, dead space is often created at the corners of a square 5n where the outer surface of a secondary battery or capacitor inscribes the square 5n. Therefore, a terminal 5c connected with an electrode located on the side of a substrate is preferably made smaller. However, the size can be increased within the range of the square 5n. If the terminal 5c is too small, the secondary battery becomes unstable. Therefore, the width 5L is preferably set to more than 40% of the diameter R of the secondary battery. It is also necessary to set the width 5L to less than the diameter R of the secondary battery or capacitor so that the outside diameter of the battery or capacitor does not go beyond the inscribed square 5n.

Where stability occurring when a secondary battery is placed on a substrate is taken into consideration, the end of the terminal 5c should not be too close to the center of the secondary battery or capacitor. Where the distance from the end of the terminal 5c to the outer surface of the secondary battery or capacitor is 5m and the radius of the battery or capacitor is r, it is important to have $0 \leq 5m < r$.

However, depending on the accuracy at which the terminal is welded, the terminal 5c may jut a distance equal to about 10% of the diameter of the secondary battery or capacitor out of the square 5n. This extent is within the scope of the present invention.

Since a terminal 5b connected with an electrode located on the opposite side of the substrate juts out of the inscribed square 5n, the size is preferably made as small as possible. The stability of the secondary battery or capacitor is secured by making the terminal 5c wide. This makes use of the dead space and allows more substantial high-density packaging. Consequently, the width 5L of the terminal 5c, at its end, connected with the electrode on the substrate side and the width 5k of the terminal 5b, at its end, connected with the electrode located on the opposite side of the substrate preferably satisfy 5k<5L.

The terminal 5b connected with the electrode located on the opposite side of the substrate does not need to be positioned on a line with the terminal 5c. The packaging efficiency is also effectively increased by slightly tilting the terminal 5b such that it is located in a dead space at one corner of the inscribed square 5n. In this case, it is necessary to stabilize the secondary battery or capacitor by placing the center 5g of the secondary battery or capacitor within a triangle created by the positions 5h, 5i at which the ends of the terminal 5c connected with the electrode on the substrate side are located at corners and by the midpoint 5j between the ends of the terminal 5b connected with the electrode on the opposite side of the substrate.

In this way, the shapes and positions of the terminals 5b and 5c are determined as long as they jut out of the secondary battery or capacitor slightly within a tolerable range of stability.

In the terminal shape of surface mount type terminals of a secondary battery or capacitor which can be reflow soldered, the area occupied on a substrate by the secondary battery or capacitor fitted with the terminals can be reduced greatly by placing the terminal mounted opposite to the substrate surface within a square that the outer surface of the secondary battery or capacitor inscribes provided that the terminal mounted opposite to the substrate surface juts out of the perimeter of the square that the outer surface of the battery or capacitor inscribes. With this terminal shape, the terminal cannot be hand soldered to the substrate, because either one of the positive and negative terminals does not protrude out of the perimeter of the square that the outer surface of the secondary battery or capacitor inscribes. However, the terminal shape in accordance with the present invention permits mounting to the substrate using a reflow process. That is, the secondary battery or capacitor is passed through a reflow furnace to heat the whole battery or capacitor, and solder previously applied to the substrate is used to solder the terminal portions. Where the secondary battery or capacitor is surface-mounted, space savings can be very effectively achieved.

Where the negative electrode is placed opposite to the substrate surface as shown in FIG. 14, the positive terminal can and the negative terminal may be brought into contact with each other by the weight of the secondary battery or capacitor after reflow soldering, thus creating the possibility that the positive and negative electrodes are shorted to each other. This electrical shorting can be effectively prevented by providing at least one step on the negative terminal mounted on the negative terminal can opposite to the substrate surface.

It is impossible to eliminate variations in height between individual secondary batteries or capacitors for manufacturing reasons. Therefore, where no step is formed on the terminal connected with the electrode located on the substrate side, if the height of the secondary battery or capacitor decreases, the terminal connected with the electrode on the opposite side of the substrate will float off the substrate. As a result, electrical connection with the substrate may not be made. Variations in height between individual secondary batteries or capacitors can be absorbed by an amount corresponding to the step. The step may be set, taking account of the height variations. Where a terminal having a step is used, if the height of the secondary battery or capacitor deviates from a target value, the surface of the terminal that is electrically connected with the substrate may not be parallel to the substrate. In this case, the portion (i.e., a portion bent because of the presence of a step or the end portion of the surface of the terminal that is electrically connected with the substrate) that rises from the surface of the terminal that is electrically connected with the substrate comes into contact with the substrate. During reflow, the solder begins to melt at this location and is electrically connected. It is very advantageous to place solder at this location. The method of placing solder can be dipping, plating, or other method. No limitations are imposed on this method.

DESCRIPTION OF THE PREFERRED EMBODIMENTS

Embodiment 1

Figure 1:
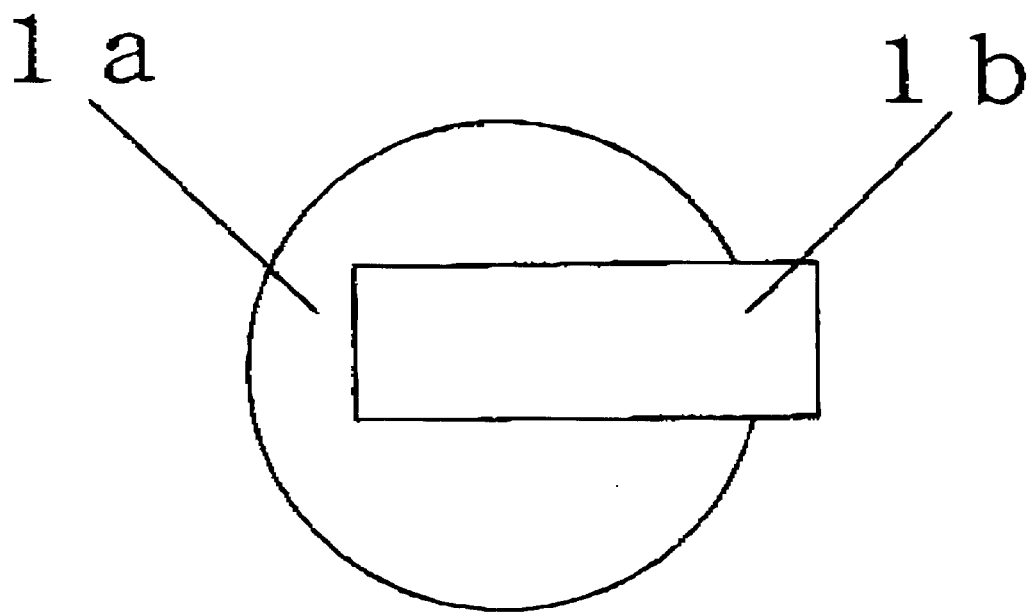
FIG. 1 is a plan view of a conventional secondary battery or capacitor fitted with terminals which are designed to be inserted into a substrate.
Figure 2:
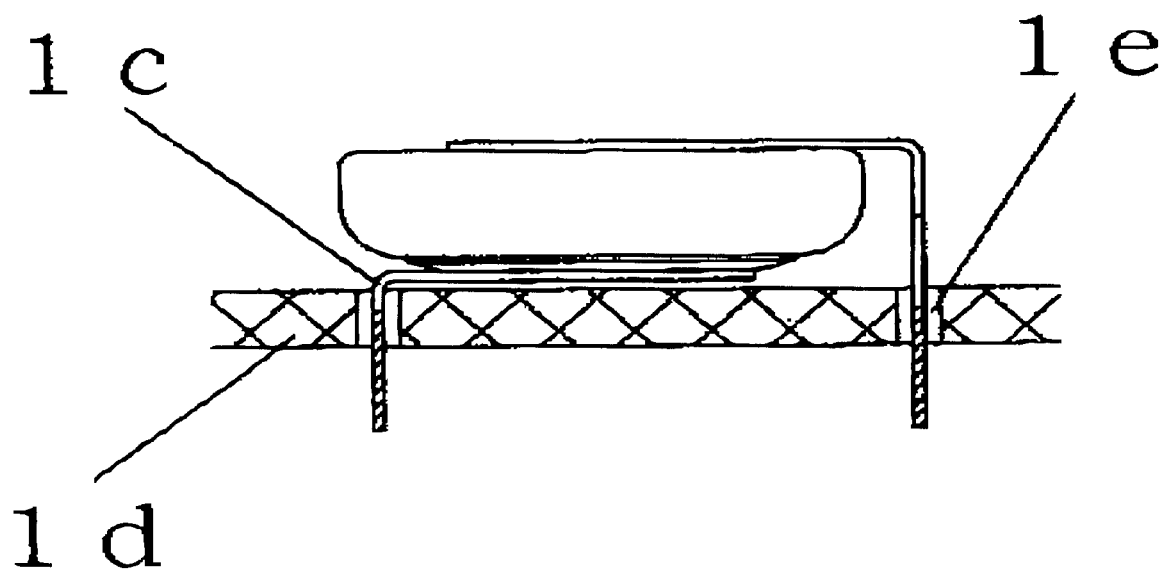
FIG. 2 is a side elevation of the conventional secondary battery or capacitor with terminals, and in which the battery or capacitor has been inserted into the substrate.
Figure 3:
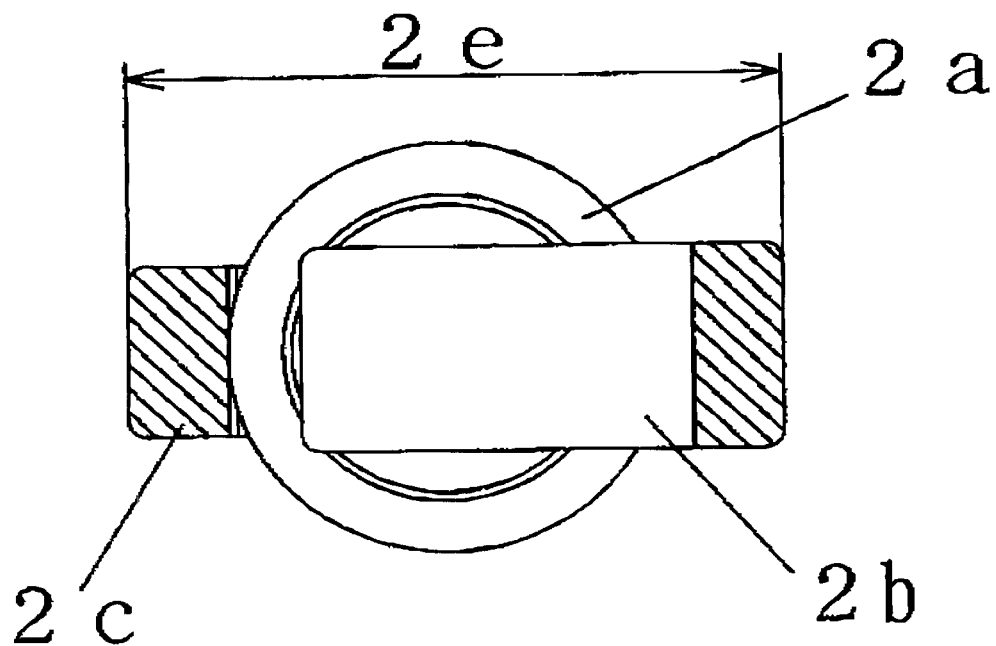
FIG. 3 is a plan view of a conventional secondary battery or capacitor fitted with terminals.
Figure 4:
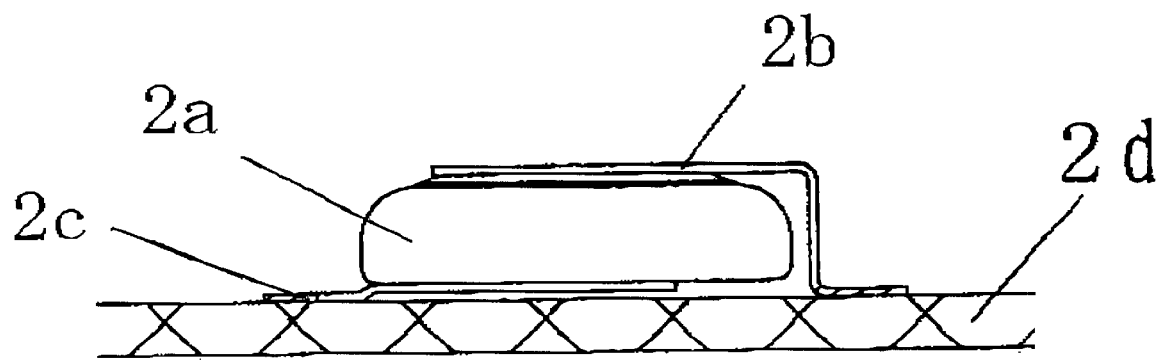
FIG. 4 is a side elevation of the conventional secondary battery or capacitor fitted with terminals, and in which the battery or capacitor has been surface-mounted to a substrate.
Figure 9:
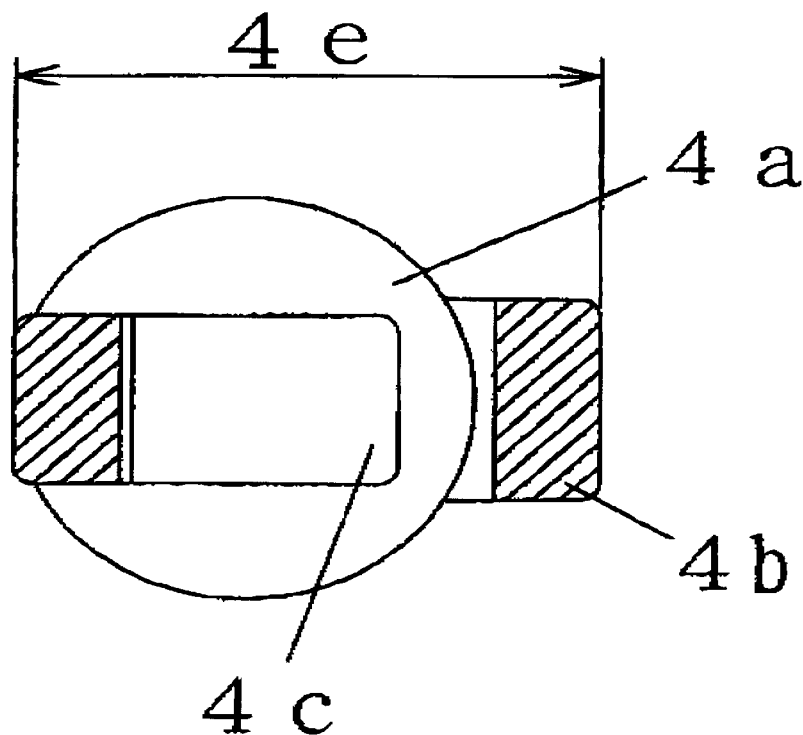
FIG. 9 is a bottom view of a secondary battery or capacitor fitted with terminals according to the present invention.
Figure 10:
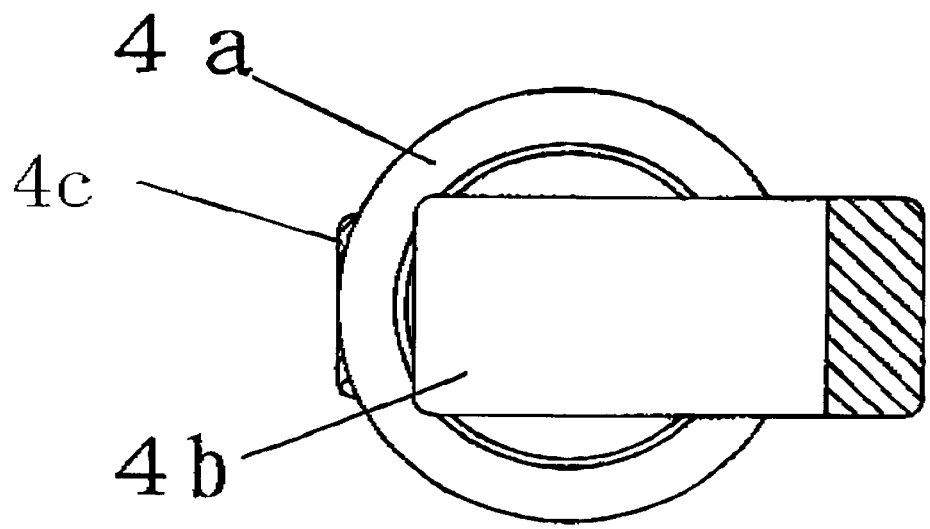
FIG. 10 is a plan view of a secondary battery or capacitor fitted with terminals according to the present invention.
Figure 11:
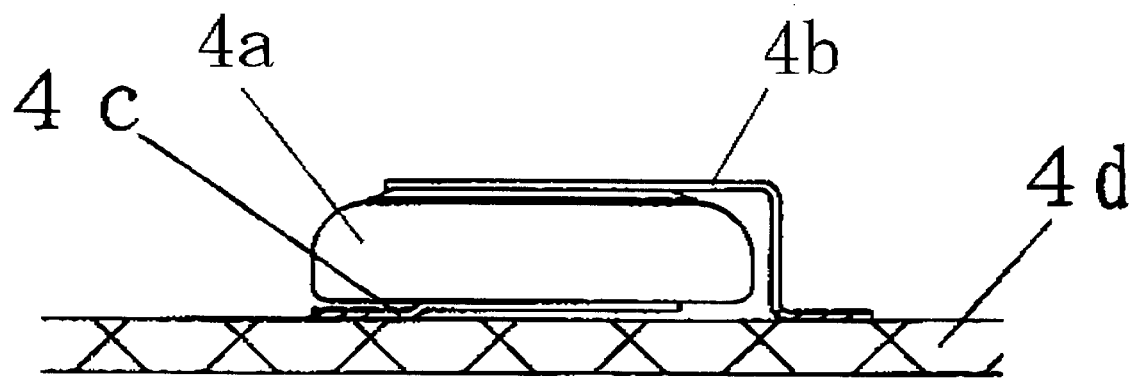
FIG. 11 is a side elevation of a secondary battery or capacitor fitted with terminals according to the present invention, and in which the battery or capacitor has been surface-mounted to a substrate.

In a 414-size capacitor having a diameter of 4.8 mm and a thickness of 1.4 mm, the positive terminal was mounted inside a square that the capacitor inscribed. The negative terminal was mounted at a normal position. Thus, an inventive product (FIGS. 9–11) in accordance with the present invention was fabricated. With respect to the inventive product and the conventional product (FIGS. 3–4), the length ($4e$, $2e$) between the front end of the positive terminal and the front end of the negative terminal was measured. The lengths were compared (Table 1). FIG. 9 is a bottom view of a secondary battery or capacitor in accordance with the present invention. FIG. 10 is a plan view of the secondary battery or capacitor in accordance with the invention. FIG. 11 is a side elevation of a secondary battery or capacitor in accordance with the invention, and in which the battery or capacitor is mounted on a packaging substrate. Shown in these figures are the secondary battery or capacitor $4a$, a negative terminal $4b$ welded to a negative electrode can, a positive terminal $4c$ welded to a positive electrode can, and a packaging substrate $4d$ on which an electronic circuit is wired. The hatched portions of the terminals $4b$ and $4c$ are front end portions of the solder-plated terminals $4b$ and $4c$ and soldered to solder portions on the packaging substrate $4d$. $4e$ shown in FIG. 9 is the length between the front end portion of the negative terminal $4b$ and the front end portion of the positive terminal $4c$. This length is defined as the total length including the terminals. FIG. 3 is a plan view of a conventional secondary battery or capacitor. FIG. 4 is a side elevation of the conventional secondary battery or capacitor, and in which the battery or capacitor is mounted on a packaging substrate. Shown in these figures are the secondary battery or capacitor $2a$, a negative terminal $2b$ welded to a negative electrode can, a positive terminal $2c$ welded to a positive electrode can, and a packaging substrate $2d$ on which an electronic circuit is wired. The hatched portions of the terminals $2b$ and $2c$ are front end portions of the solder-plated terminals $2b$ and $2c$ and soldered to solder portions on the packaging substrate $2d$. $2e$ shown in FIG. 3 is the length between the front end portion of the negative terminal $2b$ and the front end portion of the positive terminal $2c$. This length is defined as the total length including the terminals.

TABLE 1

(total length including terminals (mm))

|  | total length including terminals |
|---|---|
| Inventive Products | 7.0 at maximum |
| Prior Art Products | 8.3 at maximum |

As indicated in Table 1, the maximum value of the total lengths $4e$ of the inventive products including the terminals was 7.0 mm. The maximum value of the total lengths $2e$ of the prior art products including the terminals was 8.3 mm. The total length of the inventive products was shorter than that of the prior art products by about 15%. The inventive and prior art products were evaluated whether their positive and negative terminals could be reflow soldered to packaging substrates. The results are indicated in Table 2. A hot air type reflow furnace was used as a reflow furnace.

TABLE 2

(solderability percentage after reflow process)

|  | percentage (%) of products that could be soldered |
|---|---|
| Inventive Products | 100 |
| Prior Art Products | 100 |

As can be seen from Table 2, inventive products in which the positive terminals were placed within the perimeter of a square that the outer surface of the capacitor inscribed could be soldered at a success rate of 100% in the same way as prior art products. No issues were found at all.

Embodiment 2

In a 414-size capacitor having a diameter of 4.8 mm and a thickness of 1.4 mm, the negative terminal was mounted within the perimeter of a square that the capacitor inscribed. The positive terminal was mounted at a normal position. Thus, inventive products (FIGS. 12–14) in accordance with the present invention were fabricated. With respect to the inventive products and the conventional products (FIGS. 5–6), the length ($4f$, $2f$) between the front end of the positive terminal and the front end of the negative terminal was measured. Their lengths were compared (Table 3).

Figure 5:
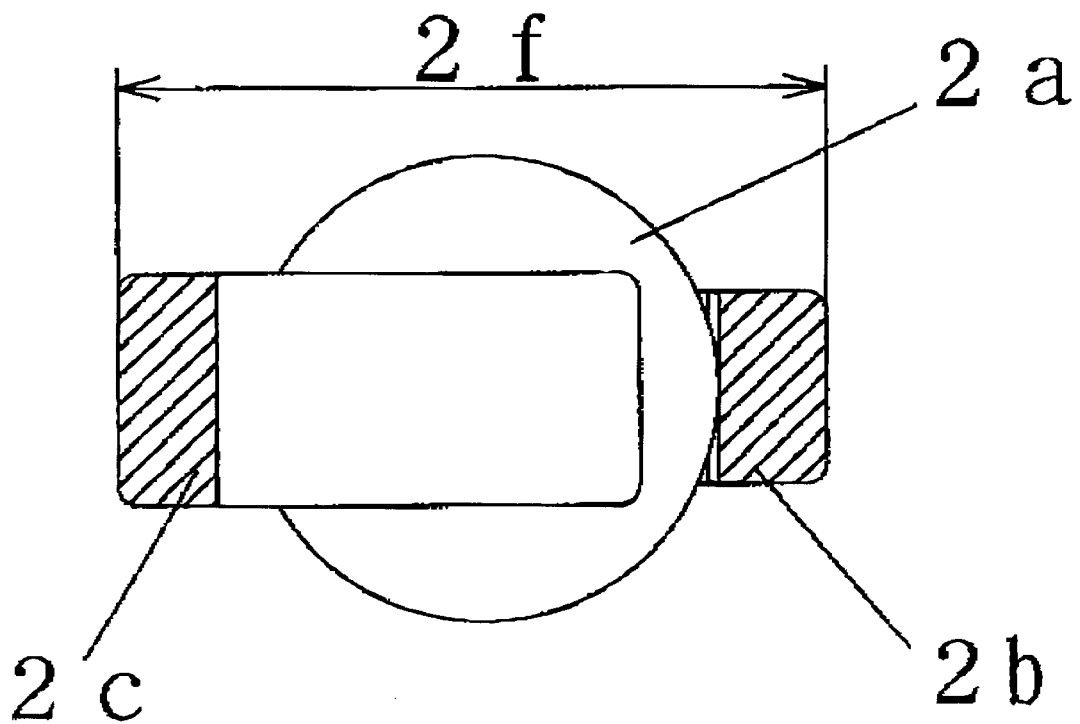
FIG. 5 is a bottom view of a conventional secondary battery or capacitor fitted with terminals.
Figure 6:
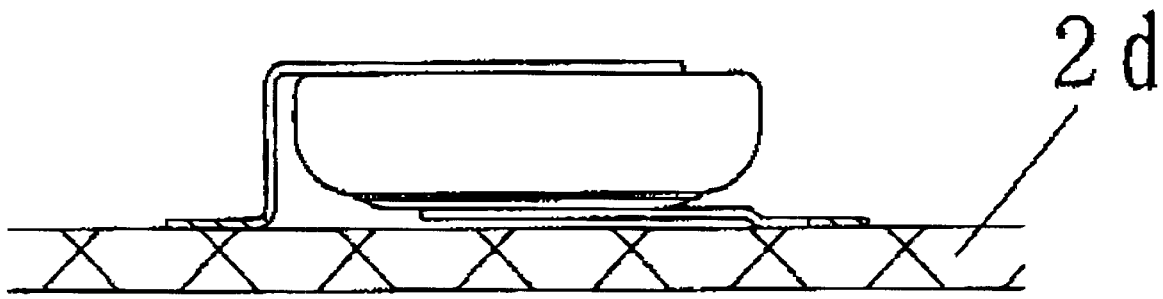
FIG. 6 is a side elevation of the conventional secondary battery or capacitor fitted with terminals, and in which the battery or capacitor has been surface-mounted to a substrate.
Figure 7:
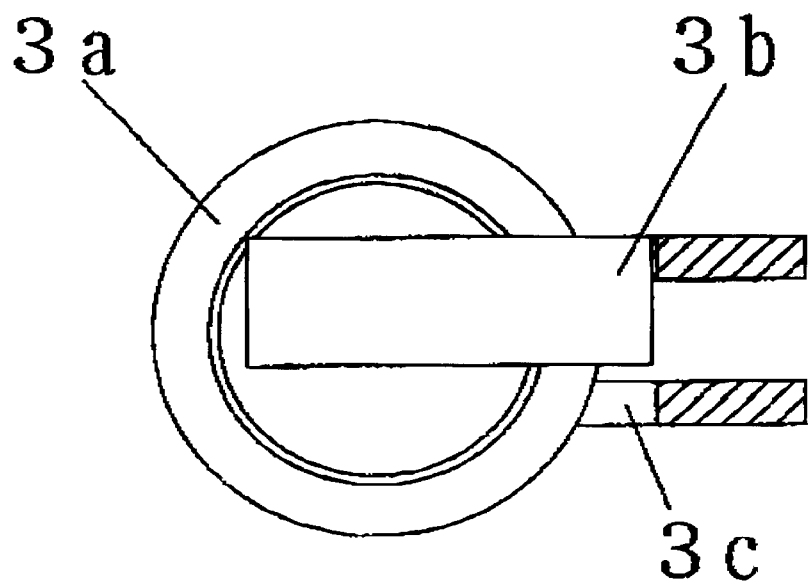
FIG. 7 is a plan view of a conventional secondary battery or capacitor fitted with terminals.
Figure 8:
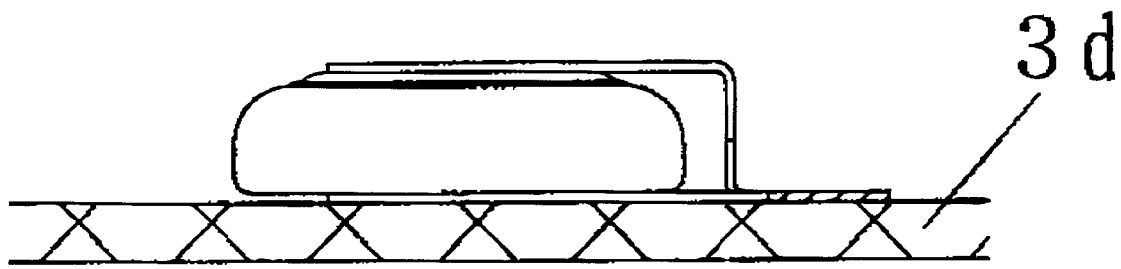
FIG. 8 is a side elevation of the conventional secondary battery or capacitor fitted with terminals, and in which the battery or capacitor has been surface-mounted to a substrate.
Figure 12:
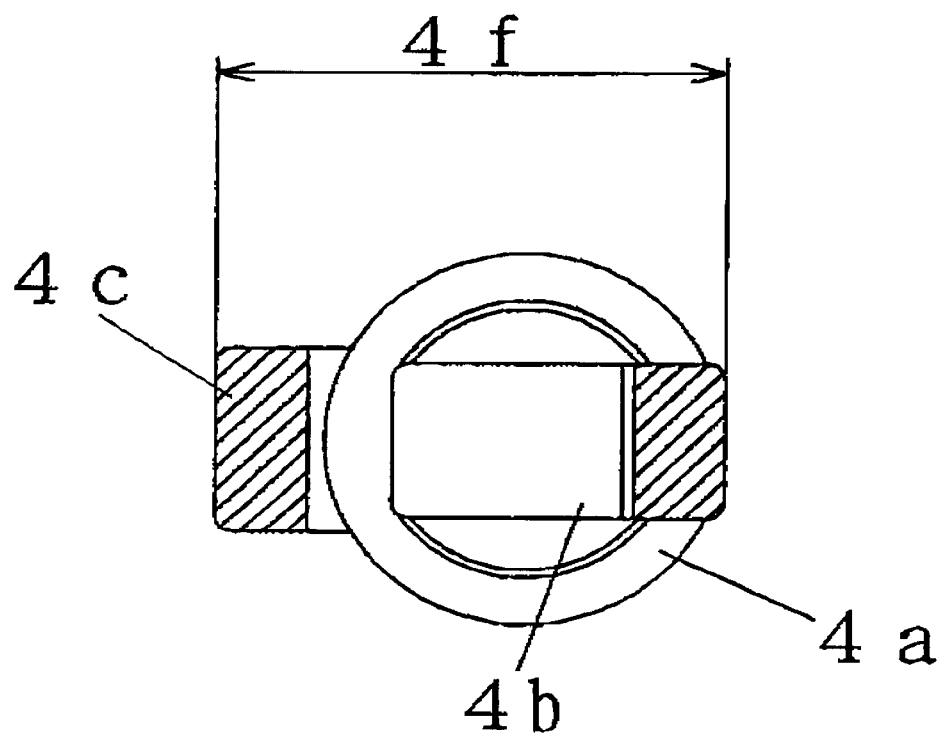
FIG. 12 is a plan view of a secondary battery or capacitor fitted with terminals according to the present invention.
Figure 13:
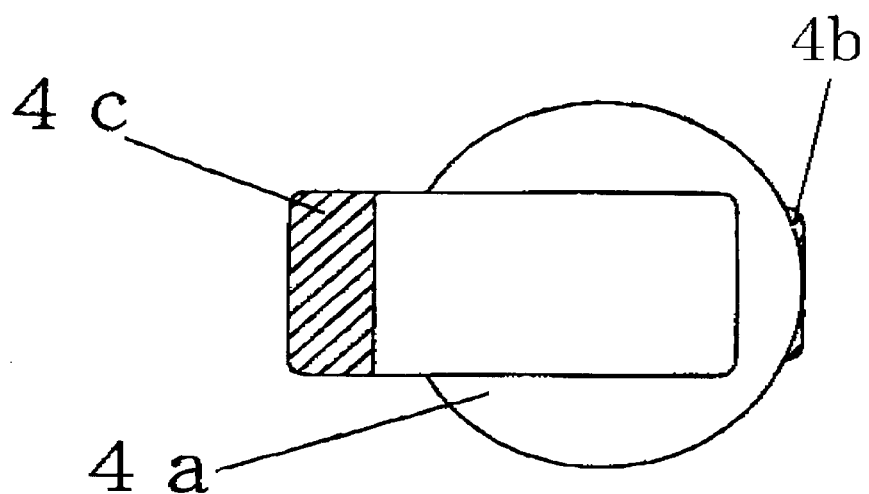
FIG. 13 is a bottom view of a secondary battery or capacitor fitted with terminals according to the present invention.
Figure 14:
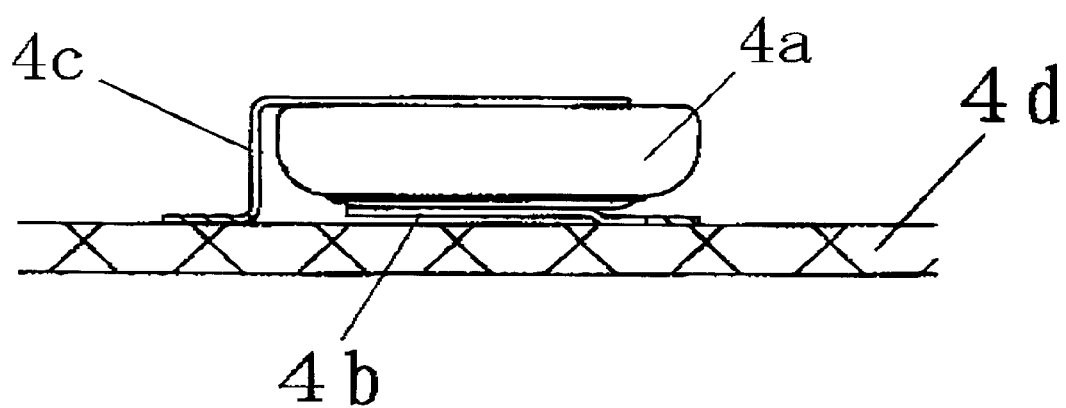
FIG. 14 is a side elevation of the secondary battery or capacitor fitted with terminals according to the present invention, and in which the battery or capacitor has been surface-mounted to a substrate.
Figure 15:
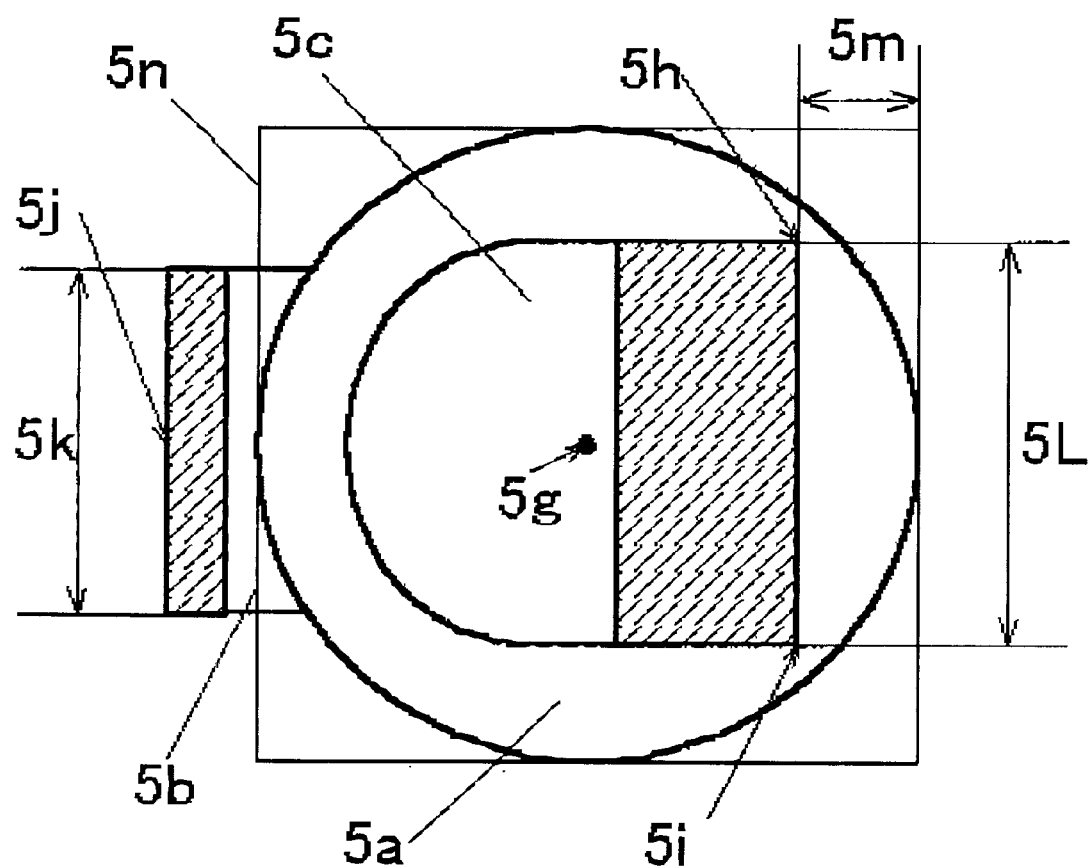
FIG. 15 is a bottom view of the secondary battery or capacitor fitted with terminals according to the invention.

FIG. 12 is a plan view of a secondary battery or capacitor in accordance with the present invention. FIG. 13 is a bottom view of the secondary battery or capacitor in accordance with the invention. FIG. 14 is a side elevation of the secondary battery or capacitor in accordance with the invention, and in which the battery or capacitor is mounted on a packaging substrate. Shown in these figures are the secondary battery or capacitor $4a$, a negative terminal $4b$ welded to the negative electrode can, a positive terminal $4c$ welded to the positive electrode can, and the packaging substrate $4d$ on which an electronic circuit is wired. The hatched portions of the terminals $4b$ and $4c$ are front end portions of the solder-plated terminals $4b$ and $4c$ and soldered to solder portions on the packaging substrate $4d$. $4f$ shown in FIG. 12 is the length between the front end portion of the negative terminal $4b$ and the front end portion of the positive terminal $4c$. This length is defined as the total length including the terminals. FIG. 5 is a bottom view of a conventional secondary battery or capacitor. FIG. 6 is a side elevation of the conventional secondary battery or capacitor, and in which the battery or capacitor is mounted on a packaging substrate. Shown in these figure are the secondary battery or capacitor $2a$, a negative terminal $2b$ welded to the negative electrode can, a positive terminal $2c$ welded to the positive electrode can, and the packaging substrate $2d$ on which an electronic circuit is wired. The hatched portions of the terminals $2b$ and $2c$ are front end portions of the solder-plated terminals $2b$ and $2c$ and soldered to solder portions on the packaging substrate $2d$. $2f$ shown in FIG. 5 is the length between the front end portion of the negative terminal $2b$ and the front end portion of the positive terminal $2c$. This length is defined as the total length including the terminals.

TABLE 3

(total length including terminals (mm))

|  | total length including terminals |
|---|---|
| Inventive Products | 6.3 at maximum |
| Prior Art Products | 7.6 at maximum |

As can be seen from Table 3, the maximum value of the total lengths $4f$ including the terminals of the inventive products was 6.3 mm. On the other hand, the maximum value of the total lengths 2f including the terminals of the prior art products was 7.6 mm. The inventive product was shorter in total length than the prior art product by about 17%.

The inventive and prior art products were evaluated whether their positive and negative terminals could be reflow soldered to packaging substrates. The results are indicated in Table 2. A hot air type reflow furnace was used as a reflow furnace.

TABLE 4

(solderability percentage after reflow process)

| | percentage (%) of products that could be soldered |
|---|---|
| Inventive Products | 100 |
| Prior Art Products | 100 |

As can be seen from Table 4, inventive products in which the negative terminals were placed within the perimeter of a square that the outer surface of the capacitor inscribed could be soldered, by a hot air reflow process at a success rate of 100% in the same way as prior art products. No issues were found at all.

In the present invention, either one of the positive and negative terminal is placed substantially inside the perimeter of a square that the outer surface of a secondary battery or capacitor inscribes. Therefore, where the secondary battery or capacitor fitted with the terminals is reflow soldered to a substrate, the area occupied on the substrate by the secondary battery or capacitor fitted with the terminals can be reduced greatly. Furthermore, the invention is advantageous for miniaturization of portable devices and so on typified by mobile phones using such secondary batteries or capacitors fitted with terminals. Thus, the present invention contributes greatly to the industry.

What is claimed is:

1. A secondary battery comprising:
a terminal connected with an electrode at a side of a substrate and having a width of L that satisfies $0.4 \times R \leq L \leq R$ where R is the diameter of the secondary battery,
wherein the distance M from an end of the terminal to the outer surface of the secondary battery satisfies $0 \leq M < r$ where r is the radius of the secondary battery.

2. A secondary battery as set forth in claim 1, wherein the width L of the terminal, at its end, connected with the electrode at a side of the substrate and the width K of a terminal, at its end, connected with an electrode located on the opposite side of the substrate satisfy $K < L$.

3. A secondary battery as set forth in claim 1, wherein the center of the secondary battery is located inside a triangle created by positions at which ends of the terminal connected with the electrode on the substrate side are located at corners and by the midpoint between the ends of the terminal connected with the electrode on the opposite side of the substrate.

4. A secondary battery fitted with positive and negative terminals mounted to take leads as set forth in claim 1, wherein the terminal connected with the electrode at the substrate side has at least one step.

5. A secondary battery fitted with positive and negative terminals mounted to take leads as set forth in claim 1, wherein solder is placed on a surface of said terminal that is electrically connected with the substrate.

6. A secondary battery fitted with positive and negative terminals mounted to take leads as set forth in claim 1, wherein solder is placed on a portion rising from a surface of said terminal which is electrically connected with the substrate.

7. A capacitor fitted with positive and negative terminals mounted to take leads, said capacitor comprising:
a terminal connected with an electrode at a side of a substrate and having a width of L that satisfies $0.4 \times R \leq L \leq R$ where R is the diameter of the capacitor,
wherein the distance M from an end of the terminal to the outer surface of the capacitor satisfies $0 \leq M < r$ where r is the radius of the capacitor.

8. A capacitor as set forth in claim 7, wherein the width L of the terminal, at its end, connected with the electrode at a side of the substrate and the width K of a terminal, at its end, connected with an electrode located on the opposite side of the substrate satisfy $K < L$.

9. A capacitor as set forth in claim 7, wherein the center of the capacitor is located inside a triangle created by positions at which ends of the terminal connected with the electrode on the substrate side are located at corners and by the midpoint between the ends of the terminal connected with the electrode on the opposite side of the substrate.

10. A capacitor as set forth in claim 7, wherein the terminal connected with the electrode at the substrate side has at least one step.

11. A capacitor as set forth in claim 7, wherein solder is placed on a surface of said terminal that is electrically connected with the substrate.

12. A capacitor as set forth in claim 7, wherein solder is placed on a portion rising from a surface of the terminal which is electrically connected with the substrate.

* * * * *